United States Patent [19]
Boie

[11] 4,282,437
[45] Aug. 4, 1981

[54] CHARGED PARTICLE BEAM LITHOGRAPHY

[75] Inventor: Robert A. Boie, Bellport, N.Y.

[73] Assignee: Bell Telephone Laboratories, Incorporated, Murray Hill, N.J.

[21] Appl. No.: 104,377

[22] Filed: Dec. 17, 1979

[51] Int. Cl.³ .................. A61K 27/02; G01K 1/08
[52] U.S. Cl. ................... 250/492 A; 250/398
[58] Field of Search ............ 250/492 A, 398, 311

[56] References Cited

U.S. PATENT DOCUMENTS

| 4,112,305 | 9/1978 | Goto et al. | 250/492 A |
| 4,167,676 | 9/1979 | Collier | 250/492 A |
| 4,182,958 | 1/1980 | Goto et al. | 250/398 |

*Primary Examiner*—Harold A. Dixon
*Attorney, Agent, or Firm*—Lucian C. Canepa

[57] ABSTRACT

In a high-throughput electron beam exposure system, an electron spot is rapidly scanned across a mask plate that includes an aperture whose opening dimension parallel to one axis varies as a function of position along another axis. The extent of each scan across the aperture purposely exceeds the opening dimension of the aperture at any specified scanning position. In this way, the relatively inaccurate end or on-off portions of each scan line are in effect mechanically blanked by the apertured plate. High-speed uniform scanning of an electron spot along a precisely defined line segment on a surface to be irradiated is thereby realized. Such a system is characterized by high-speed exposure of the surface with excellent edge definition of specified features.

15 Claims, 7 Drawing Figures

CHARGED PARTICLE BEAM LITHOGRAPHY

BACKGROUND OF THE INVENTION

This invention relates to charged-particle-beam lithography and, more particularly, to a technique for scanning such a beam over the surface of a workpiece in a precise high-speed manner.

Considerable interest exists in utilizing an electron beam exposure system for selectively irradiating a resist-coated workpiece to define therein microminiature features of a large-scale-integrated (LSI) circuit. By controlling the beam in a highly accurate and high-speed way, it is possible to make masks for LSI circuits or to pattern a resist-coated semiconductor wafer to define the features of such circuits directly without employing masks.

An advantageous electron beam exposure system (EBES) for LSI lithography is described in U.S. Pat. No. 3,900,737, issued to R. J. Collier and D. R. Herriott. The system described therein is a practical tool for generating high-quality fine-featured LSI masks and is also capable of exposing patterns directly on resist-coated semiconductor wafers.

The EBES exposure process requires a beam of emitted electrons to be focused to a submicron size on an electron-sensitive resist layer. In practice, the diameter of the spot is also the address dimension of the system. In one particular embodiment of EBES, the focused electron spot is scanned in raster fashion across a subregion of the layer.

Various modification of EBES are possible to adapt it to meet the ever increasing demand for devices with very small feature sizes. Thus, for example, if it is desired to write 0.5-micrometer ($\mu$m)-minimum-linewidth features with 0.125-$\mu$m resolution, using the EBES scanning mode, an electron spot 0.125-$\mu$m in diameter can be employed. With high-brightness electron sources and sensitive resists, such small-spot EBES systems have the potential to serve as advantageous tools for fabricating LSI devices. But, in practice, to achieve acceptable pattern-writing speeds with such a small-spot system, it is necessary that the spot be scanned over the resist layer in a very-high-speed way. In one such specific illustrative system, the per-address exposure time during linear scanning is only approximately one nanosecond. This obviously imposes severe and difficult requirements on certain portions of the electrical circuitry included in the EBES system for precisely controlling movement of the electron spot over the resist layer.

Linear scanning of a small electron spot at very high rates in an EBES system is feasible. But, as the scanning rate is increased, the ability of the electrical circuitry in the system to precisely and reproducibly control the turning on and turning off of the spot at the beginning and end of a scan line has, heretofore, reached a point at which the end points of the scan line are no longer exactly defined with consistency. In turn, this means that at very high scanning rates the edges of features being patterned with the scanning spot are no longer defined precisely. For certain high-resolution applications, the scanning rate and therefore the throughput of EBES systems are accordingly limited by the ability of the circuitry therein to turn the scanning spot on and off with high precision.

Efforts have been directed at trying to reliably increase the turn-on and turn-off speeds of a scanning electron spot in an EBES system. Such efforts have been directed, for example, at trying to design improved high-speed circuitry for accomplishing the turn-on and turn-off functions. It was recognized that such efforts or some equivalent thereof, if successful, could significantly increase the throughput characteristics of a high-resolution EBES system.

SUMMARY OF THE INVENTION

An object of the present invention is an improved scanning technique for a charged-particle-beam lithographic system.

More specifically, an object of this invention is a high-speed beam scanning technique in which the beginning and end portions of each variable-length scan line are mechanically blanked from appearing on the surface of a layer being irradiated.

Briefly, these and other objects of the present invention are realized in a specific illustrative charged-particle-beam exposure system designed for high-speed raster scanning of designated regions of a resist-coated workpiece. Such a system includes in the beam column thereof a plate having an aperture whose height varies along the width dimension thereof. After positioning the beam at a specified position along the width dimension, the system scans the beam across the aperture along the height dimension. The extent of each such scan purposely exceeds the height dimension at the specified scanning position. In this way, the relatively inaccurate end or on-off portions of each scan line are in effect mechanically blanked by the apertured plate. High-speed uniform scanning of a spot along a precisely defined line segment on a surface to be irradiated is thereby realized. Such a system is characterized by high-speed exposure of the surface with excellent edge defintion of patterned features.

More specifically, a particular illustrative apparatus made in accordance with the principles of applicant's invention is adapted to carry out high-speed scanning of an electron beam over the surface of a resist-coated workpiece in which high-resolution features are to be precisely defined. The apparatus, which includes a source for forming an electron beam, comprises an apertured plate interposed in the path of the beam, the aperture in the plate having respectively different opening dimensions measured parallel to one axis of the aperture at different locations along a positional axis which may or may not be perpendicular to the one axis. In addition, the apparatus comprises a lens interposed between the source and the plate for imaging the beam onto the plate. Further, the apparatus comprises a deflection unit also interposed between the source and the plate for positioning the beam at any specified location along the positional axis of the aperture and for scanning the beam parallel to the one axis along an extent that exceeds the opening dimension of the aperture at the specified location, whereby only an aperture-edge-defined line segment portion of the scanned beam is transmitted through the apertured plate. Moreover, the apparatus comprises a lens interposed in the path of the transmitted line segment portion for imaging the segment onto the surface of the workpiece and further comprises a unit also interposed in the path of the transmitted line segment portion for deflecting the segment over the surface of the workpiece to irradiate a specified pattern therein.

BRIEF DESCRIPTION OF THE DRAWING

A complete understanding of the present invention and of the above and other objects may be gained from a consideration of the following detailed description presented hereinbelow in connection with the accompanying drawing, in which.

DETAILED DESCRIPTION

Figure 1:
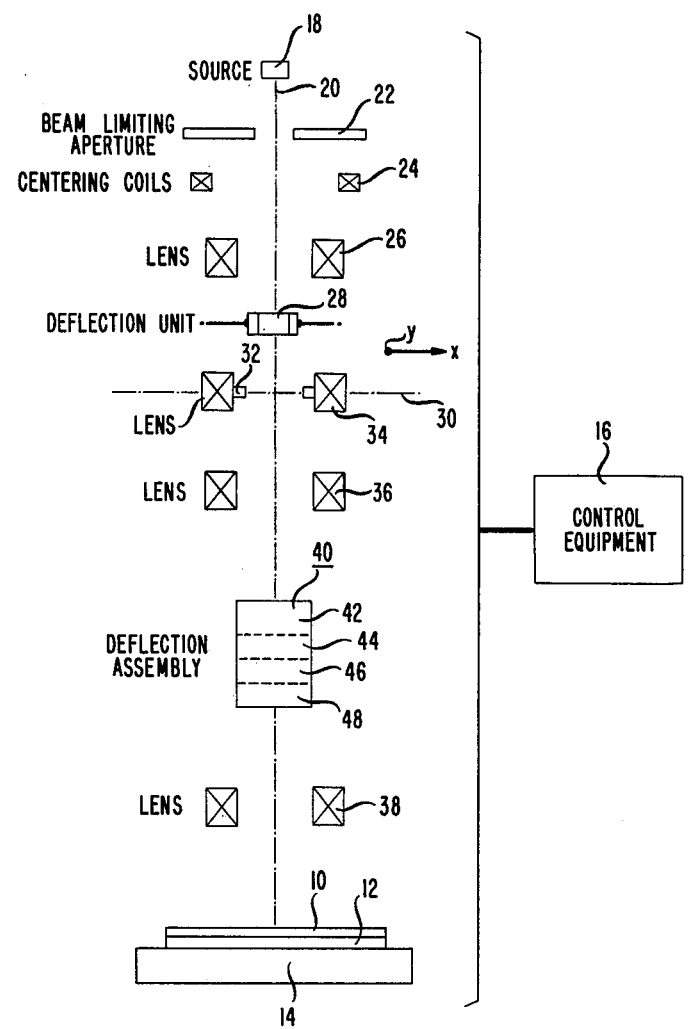
FIG. 1 is a diagrammatic representation of a specific illustrative electron beam exposure system made in accordance with the principles of the present invention.

FIG. 1 depicts a specific illustrative lithographic apparatus for controllably moving an electron spot to any designated position on the top surface of an electron-sensitive resist layer 10 supported on a substrate 12. In turn, the substrate 12 is mounted on a conventional x-y-movable table 14.

Various positive and negative resist materials suitable for use as the layer 10 are well known in the art. By selectively scanning the electron spot over the surface of the resist layer 10 in a highly accurate and high-speed manner, it is possible to make integrated circuit masks or to write directly on a resist-coated wafer to fabricate extremely small and precise low-cost integrated circuits.

The apparatus of FIG. 1 may be considered to comprise two main constituents. One is an electron beam column, to be described in detail below, which is characterized by highly accurate high-speed deflection capabilities. The deflection units and lenses included in the column are standard elements known to workers in the art. But, in addition, in accordance with the principles of the present invention, the depicted column is further characterized by a variable-line-length scanning capability that involves a unique apertured plate. This last-mentioned capability in particular will be described in detail below.

The other main constituent of the FIG. 1 apparatus comprises control equipment 16. Illustratively, the equipment 16 is of the type described in the aforecited Collier-Herriott patent. The equipment 16, whose individual control, logic and memory units are standard, supplies electrical signals to the described column to systematically control movement of the electron beam over the surface of the resist layer 10. Moreover, the equipment 16 supplies control signals to the x-y table 14 to mechanically move the work surface during the electron beam scanning operation. Such movement of the table 14 can be continuous during scanning, as described in the Collier-Herriott patent, or can be controlled to take place in a conventional step-and-repeat fashion. Hereinafter, in the specific illustrative scanning mode of operation described below, continuous table motion will be assumed.

The specific illustrative electron column of FIG. 1 includes a conventional electron source 18 designed to emit a beam of electrons along a main longitudinal axis 20. For example, the source 18 may comprise a tungsten filament, or a standard lanthanum hexaboride electron emitter, or, advantageously, to provide an especially high-brightness electron spot, a field-emitter electron source of a type now well known in the art.

Illustratively, the electron column of FIG. 1 includes a conventional beam-limiting apertured plate 22 having, for example, a centrally positioned circular opening therethrough. Further, the column includes standard coils 24 by means of which the trajectories of electrons emitted from the source 18 and propagated through the plate 22 may be exactly centered with respect to the longitudinal axis 20. Thereafter, the electron beam passes through the respective centers of a standard electromagnetic lens 26 and a conventional high-speed x-y electrostatic deflection unit 28 which, illustratively, includes two pairs of spaced-apart plates.

In one specific illustrative embodiment of the principles of the present invention, the electron beam or spot propagated in the column of FIG. 1 is both magnified and imaged by the aforementioned lens 26. In one particular example, in which the diameter of the spot emitted from a field-emitter element in the source 18 is approximately 0.05 $\mu$m, the lens 26 is designed to image a magnified version thereof onto an x-y plane which is represented in FIG. 1 by reference numeral 30. By way of example, the spot imaged onto the indicated plane has a diameter of about 2.5 $\mu$m.

In accordance with the principles of the present invention, a flat apertured plate 32 is mounted in the electron column of FIG. 1 perpendicular to the longitudinal axis 20. Moreover, the center of the apertured plate 32 is advantageously positioned coincident with the intersection of the axis 20 and the x-y plane 30.

Figure 2:
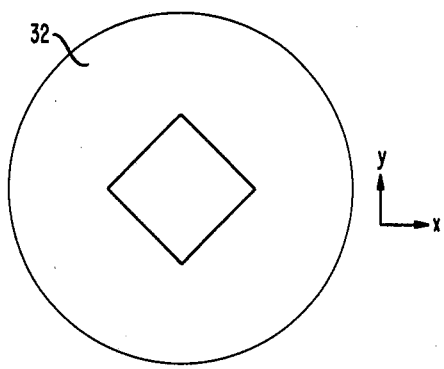
FIGS. 2 through 4 show alternative specific illustrative depictions of the geometry of an apertured plate included in the FIG. 1 system.
Figure 3:
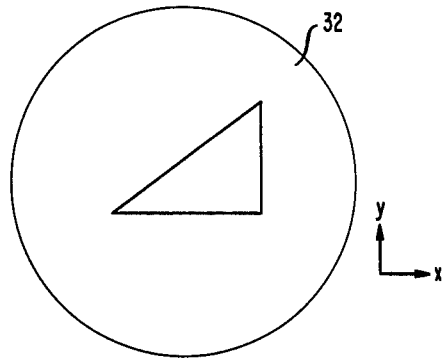
Figure 4:
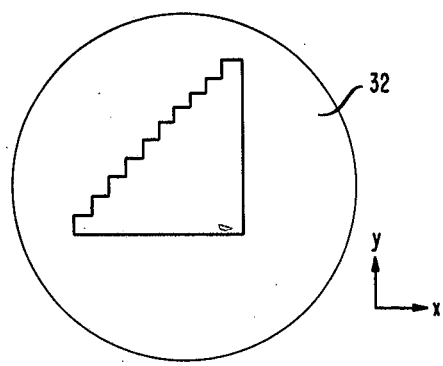

In accordance with a feature of the principles of the present invention, the plate 32 in the FIG. 1 column includes therethrough a uniquely configured aperture. Three specific illustrative examples of the type of aperture included in the plate 32 are respectively shown in FIGS. 2 through 4. In each example, the height or y-dimension extent of the aperture varies along the width or x-dimension direction of the aperture. Moreover, the width or x-dimension extent of each aperture varies along the height or y-dimension direction thereof. The apertures depicted in FIGS. 2 and 3 are characterized by continuous such variations, whereas the FIG. 4 aperture provides in effect a finite number of distinct y-direction (or x-direction) openings each having a different height (or width).

Before further describing the apertured plate 32 and the overall mode of operation of the depicted system, the other components included in the electron column of FIG. 1 will be specified. These additional components, which are individually standard and well known units, comprise three electromagnetic lenses 34, 36 and 38 and a deflection assembly 40.

By way of example only, the apertured plate 32 of FIG. 1 is shown mounted on and forming an integral unit with the lens 34. Inclusion of the lens 34 in the FIG. 1 column is not always necessary. And, even when included, the lens 34 may if desired be separate and distinct from the plate 32. If included, the lens 34 is not usually designed to magnify or demagnify the cross-sectional configuration of the electron beam on the downstream side of the plate 32. But, in combination with the next lens 36, the so-called field lens 34 serves to maximize the transmission of electrons along the depicted column and to selectively control the locations of successive beam cross-over points on the axis 20.

In one specific illustrative embodiment of this invention, the electron beam that passes through the opening in the apertured plate 32 constitutes a round spot approximately 2.5 μm in diameter. Under control of the high-speed unit 28, the electron spot is scanned across the opening in the plate 32 at a specified position, as will be described in detail later below. Thereafter, as a result of passing through the lenses 36 and 38, the propagating spot is demagnified and imaged onto the surface of the resist layer 10. In one particular case, the electron beam projected onto the layer 10 by the depicted equipment constitutes a writing spot having a diameter of about 0.125 μm.

In one specific illustrative embodiment, the assembly 40 of FIG. 1 includes a number of deflection units. By way of a particular example, the assembly 40 includes a standard electromagnetic deflection unit 42 and three conventional high-speed electrostatic deflection units 44, 46 and 48. The respective functions of these four deflection units will be evident from the specific description set forth later below.

Additionally, conventional beam blanking can be carried out in the depicted column by controlling the deflection unit 28 to cause the electron spot to impinge upon a nonapertured portion of the electron-opaque plate 32. Or a separate standard beam blanking assembly including a deflector and an associated beam blanking plate may be included in the column, as is well known in the art.

In accordance with the principles of this invention, the opening in the apertured plate 32 of FIG. 1 may comprise any one of a number of alternatives. Any geometrical configuration whose opening dimension along one axis varies as a function of position along another axis can be utilized in embodiments of applicant's invention. Three suitable such configurations are respectively illustrated in FIGS. 2 through 4. For illustrative purposes, the main emphasis in the description hereinafter will be directed to a system and a scanning technique utilizing an apertured plate 32 having a diamond-shaped opening of the type represented in FIG. 2.

Figure 5:
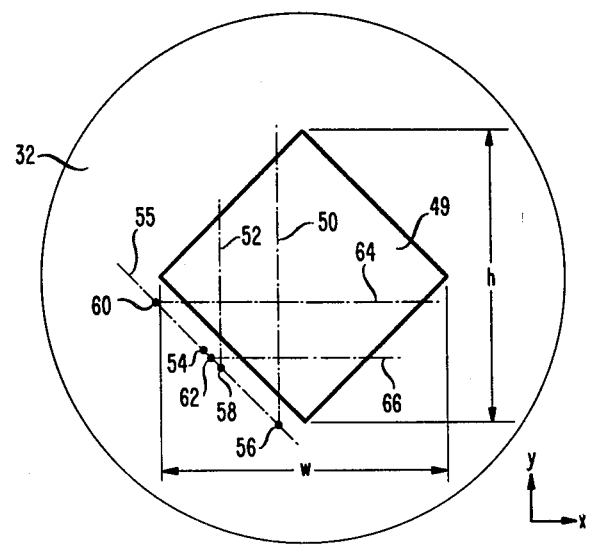
FIG. 5 shows the apertured plate of FIG. 2 and includes markings thereon that are useful in describing the scanning mode of operation of applicant's invention.

FIG. 5 is an enlarged version of FIG. 2. By way of a specific illustrative example, the maximum x-direction extent or width w of the opening 49 shown in FIG. 5 is assumed to be 48 μm, and the maximum y-direction extent or height h of the opening is also assumed to be 48 μm. In FIG. 5, dot-dash reference lines 50 and 52 indicate two of a multitude of possible vertical axes along which high-speed y-direction scanning of the aforespecified 2.5-μm-diameter electron spot may be controlled to occur. In each indicated case, scanning is designed to take place along a y-direction extent that exceeds the corresponding height of the opening 49. For example, if the height of the opening 49 at the reference line 50 is 40 μm, scanning of the electron spot in the y-direction may be controlled to occur along a 46-μm-long scan line approximately symmetrically disposed with respect to the opening 49. Similarly, if the height of the opening 49 at the reference line 52 is 20 μm, scanning may, for example, be controlled to occur along a 26-μm-long scan line approximately symmetrically disposed with respect to the opening 49.

More generally, the length of each scan line along the axes 50 and 52 of FIG. 5 is purposely designed to exceed the corresponding height of the opening 49 by a sufficient amount, both below and above the edges of the opening 49, such that the non-uniform turn-on and turn-off (or turn-around) regions of each scan line are in effect blanked by the plate 32 from appearing downstream in the electron column of FIG. 1. In each particular system, the total extent of each scan line is a function of the rate of spot movement and the capabilities of the switching circuitry in the system to initiate and terminate linear spot scanning at the selected rate. By selecting an overall scan length that includes a linear center portion transmitted through the opening 49, the variable-length scan line that is propagated in the column is highly uniform in character. In other words, the beginning and end points of the propagated scan line are precisely defined and, moreover, the exposure time per address position long the transmitted scan line is approximately everywhere the same.

In one specific illustrative mode of operation of the system shown in FIG. 1, the aforespecified electron spot is directed quiescently outside the opening 49 to impinge upon the plate 32. Accordingly, the spot is not transmitted along the column downstream of the plate 32. This quiescent position is indicated by reference numeral 54 in FIG. 5. Movement of the spot to the appropriate location for scanning along a specified y-direction reference axis is accomplished by applying electrical signals from the control equipment 16 to the deflection unit 28. Thus, for example, for scanning along the reference axis 50 of FIG. 5, the electron spot is deflected along positional axis 55 to position 56. Thereafter, in response to electrical signals applied to the y-deflection portion of the unit 28, the spot is deflected vertically along the reference axis 50. Similarly, for scanning along the reference axis 52 of FIG. 5, the electron spot is deflected to position 58 and then deflected vertically by the unit 28.

In the particular example assumed earlier above, the length of the scanning line 50 bounded by the edges of the opening 49 of FIG. 5 is 40 μm, and the corresponding length of the line 52 is 20 μm. For the assumed case in which a 20:1 demagnification occurs between the plate 32 and the resist layer 10 of FIG. 1, these 40 μm and 20 μm scan lengths appear as 2 μm and 1 μm scan lengths on the layer 10. In other words, if a 2.5-μm-diameter spot is scanned vertically along the reference line 50 of FIG. 5 by the deflection unit 28, a series of 0.125-μm-diameter spots is projected onto the layer 10 to form a line segment 2 μm high. In the same way, a 1-μm-high line segment can be formed on the layer 10 by scanning the same spot along the reference line 52. Additionally, by a combination of moving the table 14 and utilizing the deflection assembly 40 to scan specified portions of the resist layer 10, the aforespecified line segments can be employed to pattern features in the layer 10, as will be described in more detail later below.

With the particular diamond-shaped opening 49 shown in FIG. 5, horizontally extending uniform line scan segments may also be formed on the layer 10. Thus, for example, by moving the electron spot from its quiescent position 54 to position 60, or to position 62, and then respectively scanning the spot horizontally along reference line 64, or along reference line 66, exact-length horizontal line segments are defined on the layer 10. In FIG. 5, the portion of the line 64 bounded by the edges of the opening 49 is assumed, for example, to be 40 μm long, and the portion of the line 66 so bounded is assumed to be 20 μm long.

Figure 6:
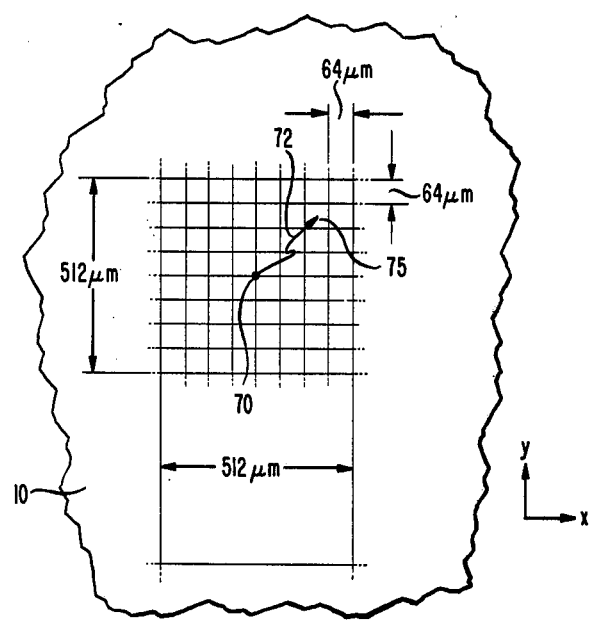
FIG. 6 represents a limited portion of the surface of a resist-coated workpiece to be irradiated by the FIG. 1 system.

FIG. 6 shows a portion of the surface of a continuously moving resist-coated mask or wafer member to be selectively irradiated by a lithographic system that embodies the principles of applicant's invention. For ease of discussion and conceputualization, a limited region or field of the depicted portion is marked in FIG. 6 with horizontal and vertical lines (which of course do not actually exist on the surface of the resist layer 10). For illustrative purposes, a field measuring 512 $\mu$m by 512 $\mu$m is shown. Movement of a writing electron spot 70 to any specified one of sixty-four 64 $\mu$m-by-64 $\mu$m subfields of the indicated field is accomplished by the aforementioned electromagnetic deflection unit 42 included in the assembly 40 (FIG. 1). By way of a specific example, arrow 72 in FIG. 6 indicates that the control equipment 16 has signaled the unit 42 to move the electron spot to, for example, subfield 75.

Figure 7:
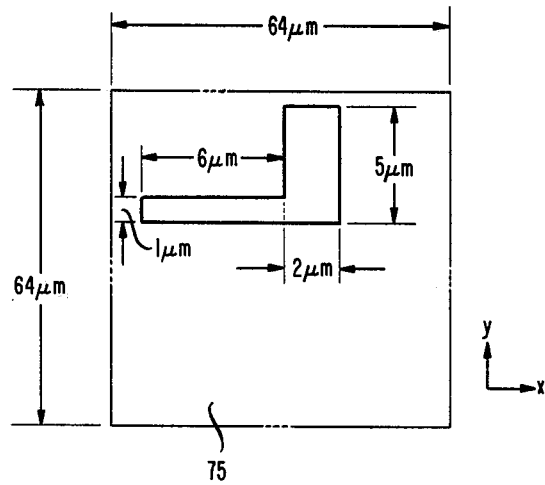
FIG. 7, which is an enlarged version of a subportion of the FIG. 6 representation, shows a particular pattern to be defined by applicant's scanning technique.

An enlarged version of subfield 75 is shown in FIG. 7. Moreover, a particular feature to be irradiated in the subfield is also depicted in FIG. 7. The feature may be considered to comprise a 1 $\mu$m-by-6 $\mu$m portion and a 2 $\mu$m-by-5 $\mu$m portion.

In one advantageous scanning mode of operation, the electron spot moved to the subfield 75 (FIG. 7) by the electromagnetic deflection unit 42 is deflected by the electrostatic unit 44 in the assembly 40 to the left-hand end of the aforementioned 1 $\mu$m-by-6 $\mu$m portion shown in FIG. 7. Thereafter, a demagnifed and focused version of the spot scanned across the aperture 49 in the plate 32 is scanned in the y direction of FIG. 7 to form a 1-$\mu$m line segment at the left-most end of the 1 $\mu$m-by-6 $\mu$m portion. As specified previously above, such a 1-$\mu$m segment is formed by selectively positioning the propagating electron spot to scan the aperture 49 along reference axis 52 (FIG. 5).

Electrostatic deflection unit 46 in the assembly 40 (FIG. 1) is utilized to supply a signal to compensate for the fact that, in accordance with applicant's unique mode of operation, the electron spot is moved by the deflection unit 28 to different positions along the axis 55 of FIG. 5. Each such signal exactly compensates in effect for the signals utilized to move the electron beam from the quiescent position 54 (FIG. 5) to position 56 or to position 58 or to any other specified position. Consequently, when the deflection unit 44 supplies a given signal to move the electron spot to a specified location on the resist layer 10, the specified location will in fact be addressed regardless of the position of the spot in the opening 49.

In one specific illustrative mode of operation, the table 14 (FIG. 1) and thus the layer 10 are continuously moving during y-direction (or x-direction) spot scanning. To avoid skewed scanning in this mode, correction signals are generated to control the electron beam to write at successive locations along a y-parallel (or x-parallel) line, as described in detail in the aforecited Collier-Heriott patent. In the herein-considered system, such correction signals are provided by the electrostatic deflection unit 48 in the assembly 40. Accordingly, each 1-$\mu$m-long scan segment utilized to irradiate the 1 $\mu$m-by-6 $\mu$m portion shown in FIG. 7 occurs exactly parallel to the indicated y axis.

The spot scanned across the opening 49 in the plate 32 (FIG. 5) along the reference axis 52 can be controlled to provide uniform scan segments in immediately successive +y and −y scans. Or, if desired, the spot can be controlled to provide such a segment in one y direction only, with a high-speed fly-back interval utilized to return the spot to a specified starting point of the unidirectional scan line. In this latter case, an additional conventional beam blanking unit is advantageously included in the column to prevent resist exposure during the fly-back intervals.

In either case, as successive 1-$\mu$m-long scan segments are generated, the 1 $\mu$m-by-6 $\mu$m portion shown in FIG. 7 is irradiated in a line-by-line fashion. After each line scan segment, the deflection unit 44 rapidly moves the spot to the right by 0.125 $\mu$m. After 48 such line scans, the entire 1 $\mu$m-by-6 $\mu$m portion has been irradiated.

Subsequently, as a basis for precisely irradiating the 2 $\mu$m-by-5 $\mu$m portion shown in FIG. 7, the deflection unit 28 (FIG. 1) moves the propagating electron spot to position 60 (FIG. 5) and then proceeds to successively scan the spot along the reference axis 64. Concurrently, the deflection unit 44 initially moves the 2-$\mu$m-long line segment thereby provided to the bottom-most part of the specified 2 $\mu$m-by-5 $\mu$m portion in the subfield 75 on the layer 10. In accordance with a feature of the principles of the present invention, forty successive such line segments respectively deflected by the unit 44 are effective to completely irradiate the specified portion in a highly precise manner.

Subsequently, while the table 14 (FIG. 1) continues to move, the unit 42 moves the electron spot to any other subfield in the 512 $\mu$m-by-512 $\mu$m field (FIG. 6) that includes pattern features to be irradiated. In any other such subfield, positioning and movement of the variable-length segment projected onto the layer 10 are controlled by the deflection units 44, 46 and 48, as described above. And, as the table 14 moves, subsequent fields on the layer 10 are brought within the deflection capabilities of the assembly 40.

Thus, in accordance with the principles of applicant's invention, a unique variable-line-length scanning mode is embodied in an EBES system. Such a system exhibits a uniform high-speed scanning characteristic and is capable of defining irradiated feature edges with high precision and reproducibility.

Finally, it is to be understood that the above-described specific arrangements and techniques are only illustrative of the principles of the present invention. In accordance with those principles, numerous modifications and alternatives may be devised by those skilled in the art without departing from the spirit and scope of the invention. Thus, for example, although emphasis herein has been primarily directed to scanning an electron beam over the surface of a resist layer, it is apparent that the principles of this invention are also applicable to selectively controlling an ion beam to scan an ion-sensitive resist layer. Herein, the term "charged particle" is intended to encompass both electrons and ions.

Moreover, although emphasis hereinabove has been directed to exposing a resist layer as a basic step in the process of producing a pattern in a workpiece, it is evident that the principles of the present invention can also be embodied in a system adapted, for example, for micromachining applications or for selectively altering the properties of a semiconductor memory.

Furthermore, other advantageous variable-line-length scanning modes are encompassed within the principles of this invention. For example, the aforedescribed deflection of the electron beam over the layer 10 by the unit 44 may be controlled to be continuous in nature. In such a case, successive scans of the beam across the aperture in the plate 32 are advantageously controlled to occur at a high rate relative to the rate of movement of such a continuously deflected beam. Such movement, which is generally controlled to occur orthogonal to the direction of scanning across the aperture in the plate 32, in effect causes a precisely defined variable-length line segment to "paint" a specified feature on the layer 10 by being swept therealong.

I claim:

1. A charged particle beam exposure system for selectively irradiating the surface of a workpiece to be patterned, said system comprising
   a source of charged particles,
   a planar apertured plate,
   means interposed between said source and said plate for focusing said charged particles onto said plate to form a spot incident on the plane of said plate, the cross-sectional area of said incident spot being small relative to the cross-sectional area of said aperture,
   the aperture in said plate being characterized by opening dimensions parallel to one axis of said plate that vary as a function of location along a positional axis of said plate,
   deflection means interposed between said source and said plate for moving said incident spot to a prescribed position along said positional axis and for then scanning said incident spot across said aperture parallel to said one axis along an extent that exceeds the opening dimension of the aperture at said prescribed position,
   and means interposed in the path of spots propagated through said mask plate for focusing said spots onto said workpiece surface.

2. A system as in claim 1 further including deflection means interposed between said plate and said workpiece surface for scanning said spots over said surface to define specified features therein.

3. Apparatus for high-speed scanning of a charged-particle beam over the surface of a workpiece in which high-resolution features are to be precisely defined, said apparatus comprising
   means for forming a charged-particle beam,
   an apertured plate interposed in the path of said beam, the aperture in said plate having respectively different opening dimensions measured parallel to one axis of the plate at different positions along a positional axis of said plate, the cross-sectional area of said aperture being an integral multiple of the cross-sectional area of the beam imaged onto said plate,
   means interposed between said forming means and said plate for imaging said beam onto said plate,
   means also interposed between said forming means and said plate for imaging said beam onto said plate,
   means also interposed between said forming means and said plate for positioning said beam at any specified location along said positional axis and for scanning the beam across said aperture parallel to said one axis along an extent that exceeds the opening dimension of said aperture to transmit only an aperture-edge-defined line segment portion of the scanned beam through the apertured plate,
   means interposed in the path of said transmitted line segment portion for imaging said segment onto the surface of said workpiece,
   and means interposed in the path of said transmitted line segment portion for deflecting said segment over the surface of said workpiece for irradiating a specified pattern therein.

4. Apparatus as in claim 3 wherein said forming means comprises means for forming an electron beam.

5. Apparatus as in claim 4 wherein each of said imaging means comprises an electromagnetic lens.

6. Apparatus as in claim 5 wherein said positioning and scanning means comprises an electrostatic deflection unit.

7. Apparatus as in claim 6 wherein said forming means includes a field-emitter source.

8. Apparatus as in claim 7 wherein said first-mentioned imaging means is adapted to project onto said plate a magnified version of the beam emitted from said source.

9. Apparatus as in claim 8 wherein said second-mentioned imaging means is adapted to project onto the surface of said workpiece a demagnified version of the beam transmitted through said apertured plate.

10. Apparatus as in claim 3 wherein said workpiece is mounted on a movable table.

11. Apparatus as in claim 10 further including means for continuously moving said table during irradiation of said workpiece.

12. Apparatus as in claim 11 wherein said deflecting means includes a deflection unit for moving said transmitted line segment over a field of said workpiece surface to any of multiple subfields therein.

13. Apparatus as in claim 12 wherein said deflecting means further includes a deflection unit for scanning a transmitted line segment in a specified subfield to define features therein.

14. Apparatus as in claim 13 wherein said deflecting mans still further includes
   means for positioning said transmitted line segment during scanning to compensate for table motion and thereby avoid skewed scanning,
   and means for positioning said transmitted line segment during scanning to compensate for the fact that said beam is positioned at different locations in the opening of said apertured plate.

15. A high-speed fabrication method that involves scanning a charged-particle beam over the surface of a workpiece in which high-resolution features are to be precisely defined, said method comprising
   forming a charged-particle beam,
   imaging said beam onto an apertured plate, the opening dimension of the aperture in said plate being different at differnet positions therealong, the cross-sectional area of said aperture being an integral multiple of the cross-sectional area of said beam,
   deflecting said beam to a specified position of said aperture,
   scanning said beam across said aperture at said specified position along an extent that exceeds the opening dimension of said aperture to cause an aperture-edge-defined line segment to be transmitted through said aperture during said scanning,
   imaging onto the surface of said workpiece the line segment of said scanned beam that is transmitted through the apertured plate,
   and deflecting said line segment on said surface to define an irradiated feature therein.

* * * * *

UNITED STATES PATENT AND TRADEMARK OFFICE
CERTIFICATE OF CORRECTION

PATENT NO. : 4,282,437

DATED : August 4, 1981

INVENTOR(S) : Robert A. Boie

It is certified that error appears in the above—identified patent and that said Letters Patent is hereby corrected as shown below:

Column 6, line 17, "long" should read --along--.
Column 9, lines 54, 55 and 56 should be deleted.
Column 10, line 36, "mans" should read --means--.

Signed and Sealed this

First Day of December 1981

[SEAL]

Attest:

GERALD J. MOSSINGHOFF

Attesting Officer    Commissioner of Patents and Trademarks